United States Patent [19]

Chaki et al.

[11] Patent Number: 4,458,545
[45] Date of Patent: Jul. 10, 1984

[54] GUIDE SHAFT IN A PUSHBUTTON TUNER

[75] Inventors: Takao Chaki; Takao Kanai, both of Tokyo, Japan

[73] Assignee: Clarion Co., Ltd., Tokyo, Japan

[21] Appl. No.: 337,337

[22] Filed: Jan. 6, 1982

[30] Foreign Application Priority Data

Jan. 12, 1981 [JP] Japan ............................ 56/1658[U]

[51] Int. Cl.³ .......................... H03J 5/12; B21K 25/00
[52] U.S. Cl. ..................................... 74/10.33; 29/509; 334/7; 308/3 R
[58] Field of Search ................ 74/10.27, 10.33, 10.37; 29/509; 334/7; 308/3 R

[56] References Cited

U.S. PATENT DOCUMENTS 2,489,544 11/1949 Schwarz et al. .................. 74/10.33
4,262,547 4/1981 Kanai et al. ...................... 74/10.33

Primary Examiner—Allan D. Herrmann
Attorney, Agent, or Firm—Flynn, Thiel, Boutell & Tanis

[57] ABSTRACT

In a guide shaft perpendicularly secured on a member with the base end thereof by caulking and serving with the outer peripheral surface thereof as a guide portion, a guide shaft characterized in that there is formed a step portion having a diameter smaller than that of the other portion thereof at the corner where the top end surface and the outer peripheral surface of the shaft intersect with each other.

2 Claims, 7 Drawing Figures

GUIDE SHAFT IN A PUSHBUTTON TUNER

BACKGROUND OF THE INVENTION

1. Field of the Invention

This invention relates to a guide shaft structure adopted to guide a cross arm in a pushbutton tuner.

2. Description of the Prior Art

As conventionally known, a pushbutton tuner used in a radio receiver, etc. is so arranged as to select one of a plurality of tuning coils when a tuning button is pushed and determine the stroke of the tuning coil inserted in the associated core, thus to select only a special broadcasting station. In order to slidably mount the pushbutton with respect to the tuner body so as to permit such a tuning operation, an upper plate 1 mounted on the tuner body is formed with guide slits 2 in each of which a guide pin 4 and a guide shaft 5 provided on a cross arm 3 are inserted to allow the cross arm 3 to slide along the guide slit 2 as shown in FIG. 1 to FIG. 3(A).

The guide pin 4 comprises a caulked portion 4a for being caulked on the cross arm 3, an inserted portion 4b to be inserted in the guide slit 2 and a flange portion 4c formed at the top end thereof for being in slidable contact with the upper surface of the upper plate 1 to regulate the downward movement of the cross arm 3. On the other hand, the guide shaft 5 comprises a caulked portion 5a for being caulked on the cross arm 3 and a guide portion 5b for being inserted in the guide slit 2 and regulating horizontal movement of the cross arm 3 with respect to the upper plate 1.

In order to precisely guide the cross arm 3 in such guide mechanism it is necessary to increase sizewise accuracy of the guide portion 5b of the guide shaft 5. The accuracy is sometimes required to an extent of 1/100 mm so that even a small deformation on the outer periphery of the guide shaft 5 is not allowable.

However, since the guide shaft 5 is to be caulked on the cross arm 3, a conventional guide shaft has had such a drawback to be apt to deform at the upper corner portion and the outer periphery thereof as shown in FIG. 3(B) due to the pressure applied thereto during caulking. Such problem has not been a mere question for a guide shaft for guiding a cross arm in a pushbutton turner but such deformation at a corner portion and an outer periphery of any other guide shaft has not been avoided, either when the guide shaft is secured on another member by means of caulking.

OBJECT OF THE INVENTION

It is therefore an object of the present invention to provide a guide shaft formed with a step portion having a diameter smaller than that of the other portion of the guide shaft at the corner where the top end surface and the outer peripheral surface of the guide shaft intersect with each other so that even when the guide shaft deforms due to the pressure applied thereto during caulking, the deformation does not appear on the outer periphery for serving as a guide.

SUMMARY OF THE INVENTION

In accordance with the present invention, there is provided a guide shaft for use in a pushbutton tuner which comprises:

a plurality of cross arms each being provided with a pushbutton at an end thereof;

an upper plate formed with a plurality of guide slits; and a plurality of guide shaft each inserted in associated one of said guide slits and secured with an end thereof on said cross arm so as to permit said cross arm to slide along said guide slit, said guide shaft being formed with a step portion having a diameter smaller than that of the other portion thereof to be inserted in said guide slit at the corner where the outer peripheral surface and the top end surface both of said portion to be inserted in said guide slit intersect with each other.

BRIEF DESCRIPTION OF THE DRAWINGS

FIG. 6 shows a side and sectional views illustrating the states of the guide shaft before and after the caulking.

DETAILED DESCRIPTION OF THE PREFERRED EMBODIMENT

Figure 1:
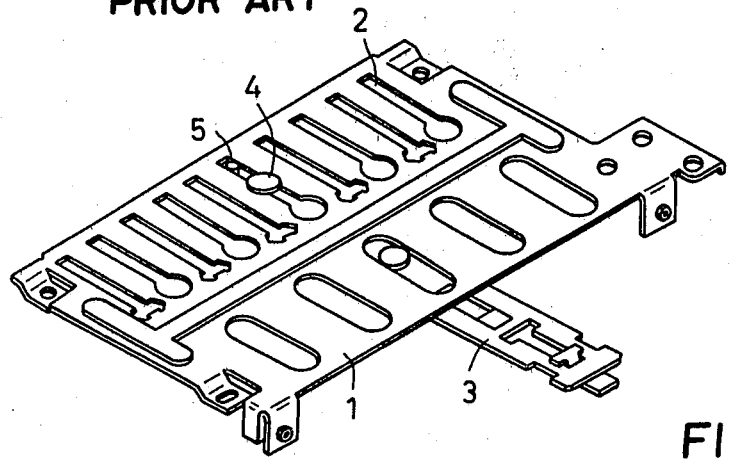
FIG. 1 shows a perspective view illustrating an example of a cross arm guide mechanism in a pushbutton tuner.
Figure 2:
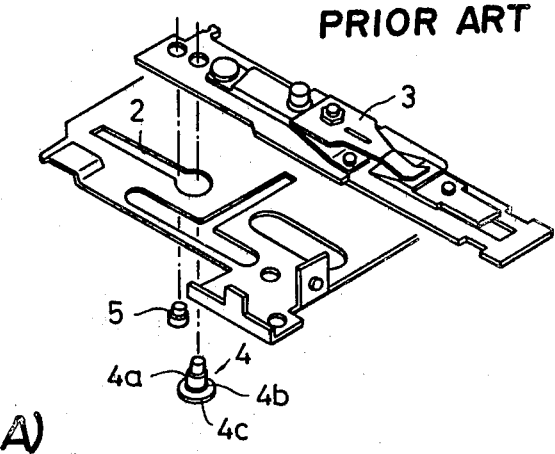
FIG. 2 shows perspective views of disassembled members of the above mechanism as seen from the backward direction of FIG. 1.
Figure 3:
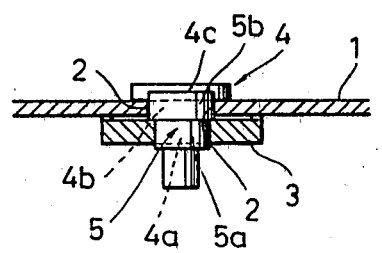
FIG. 3(A) shows a sectional view of a guide mechanism provided with a conventional shaft.
FIG. 3(B) shows a side and sectional views of the conventional shaft for illustrating the deformation.
Figure 4:
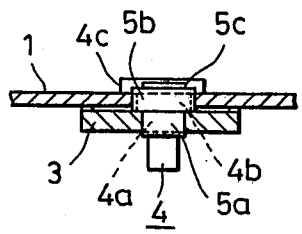
FIG. 4 shows a sectional view illustrating a guide mechanism provided with the guide shaft according to the present invention.
Figure 5:
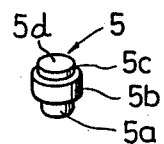
FIG. 5 shows a perspective view illustrating the guide shaft according to the present invention.
Figure 5:
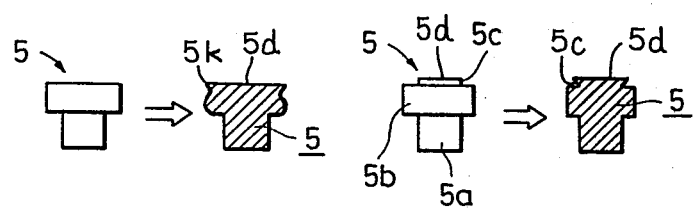

The present invention will now be described in detail referring to the preferred embodiment illustrated in the drawings where the guide shaft according to the present invention is used as a guide member for guiding a cross arm in a pushbutton tuner.

In the drawings, the reference numeral 5 designates a guide shaft having a substantially cylindrical configuration. The guide shaft 5 comprises a caulked portion 5a for being caulked on the cross arm 3 and a guide portion 5b for being inserted in the guide slit 2 of the upper plate 1. The guide portion is formed with a step portion 5c at the top end thereof so that the step portion 5c has a diameter smaller than that of the rest of the guide portion 5b. The guide shaft 5 is secured on the cross arm 3 by inserting the caulked portion 5a thereof in a mounting bore formed in the cross arm 3 and applying pressure against the lower end surface of the caulked portion 5a by means of a caulking apparatus. In this case, the top end surface 5d of the guide shaft 5 is in contact with a support plate for standing up to the pressure from the caulking apparatus and when the pressure is actually applied, the top end of the guide shaft 5 is pressed to the support plate so that the edge of the top end, i.e. the corner 5k where the top end surface 5d and the outer periphery both of the guide portion 5b intersect with each other, gets expanded and deformed.

However, in the guide shaft 5 according to the present invention where there is formed a step portion 5c in place of the corner 5k, such expansion occurs at the step portion 5c, and therefore, the outer periphery of the guide portion 5b is free from deformation.

As disclosed by the embodiment, the guide shaft according to the present invention is so arranged that even when deformation occurs in the guide shaft due to the pressure applied thereto during caulking, the deformation is absorbed in the step portion 5c provided at the top end of the guide portion and does not give any influence to the outer periphery of the guide shaft.

Therefore, according to the present invention, it is possible to keep the accuracy of the outer periphery of the guide shaft extremely high as well as to smoothly and accurately guide a member to be guided in accordance with the shaft. Particularly, due to the fact that the pressure applied during caulking does not give any influence to the outer periphery of the guide shaft, it is possible to reduce attention to be paid during caulking and accordingly to improve manufacturing efficiency. Further, due to the improvement of accuracy of the guide shaft, working time for inserting the guide shaft in a guide slit formed in member to be guided can be decreased.

We claim:

1. A guide shaft for use in a pushbutton tuner which comprises:
   a plurality of cross arms each being provided with a pushbutton at an end thereof;
   an upper plate formed with a plurality of guide slits; and a plurality of guide shafts each having a guide portion inserted in an associated one of said guide slits and an end portion extending from one end of said guide portion and secured on said cross arm so as to permit said cross arm to slide along said guide slit,
   said guide shaft further having a step portion at the opposite end thereof and having a diameter smaller than that of the guide portion, such that the outer peripheral surface of said guide portion and the exposed end surface of said step portion do not intersect with each other.

2. A guide shaft for use in a pushbutton tuner which comprises:
   a plurality of cross arms each being provided with a pushbutton at an end thereof;
   an upper plate formed with a plurality of guide slits; and
   a plurality of guide shafts each inserted in an associated one of said guide slits and secured with an end thereof on said cross arm so as to permit said cross arm to slide along said guide slit,
   said guide shaft including, in axial order, a caulked portion for being caulked on the cross arm, a guide portion for being inserted in the guide slit of the upper plate and a step portion carrying the top end surface of said guide shaft, said step portion having a diameter smaller than that of said guide portion.

* * * * *